(12) United States Patent
Itkin

(10) Patent No.: US 8,289,096 B2
(45) Date of Patent: Oct. 16, 2012

(54) WIDE BAND POLAR MODULATOR

(75) Inventor: Grigory Itkin, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/023,699

(22) Filed: Feb. 9, 2011

(65) Prior Publication Data

US 2012/0200367 A1 Aug. 9, 2012

(51) Int. Cl.
*H04L 27/20* (2006.01)
(52) U.S. Cl. ........ 332/105; 323/103; 323/104; 375/286; 375/294; 455/260

(58) Field of Classification Search .......... 332/103–105, 332/144–148; 375/279–284, 308, 286, 294; 455/260
See application file for complete search history.

(56) References Cited

U.S. PATENT DOCUMENTS 7,872,545 B2 * 1/2011 Wilhelm ........................ 332/103
* cited by examiner

*Primary Examiner* — Arnold Kinkead
(74) *Attorney, Agent, or Firm* — Eschweiler & Associates, LLC

(57) ABSTRACT

Some aspects of the present disclosure provide for polar modulation techniques that utilize an 180° phase shift module disposed downstream of a VCO-DCO. In some embodiments, this configuration allows a polar modulator to use the VCO-DCO to achieve small phase shifts (e.g., less than or equal to) 90°, while carrying out 180° phase shifts in the 180° phase shift module downstream of the VCO-DCO.

15 Claims, 8 Drawing Sheets

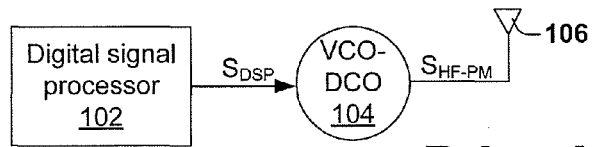
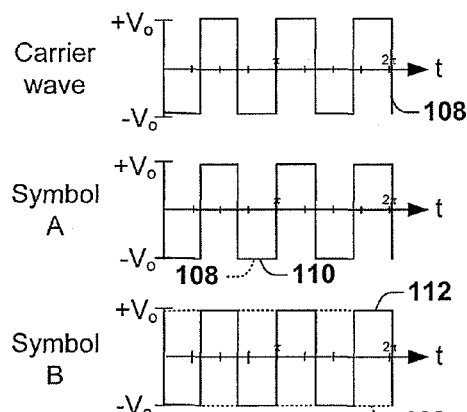
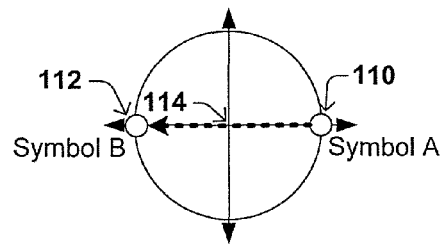
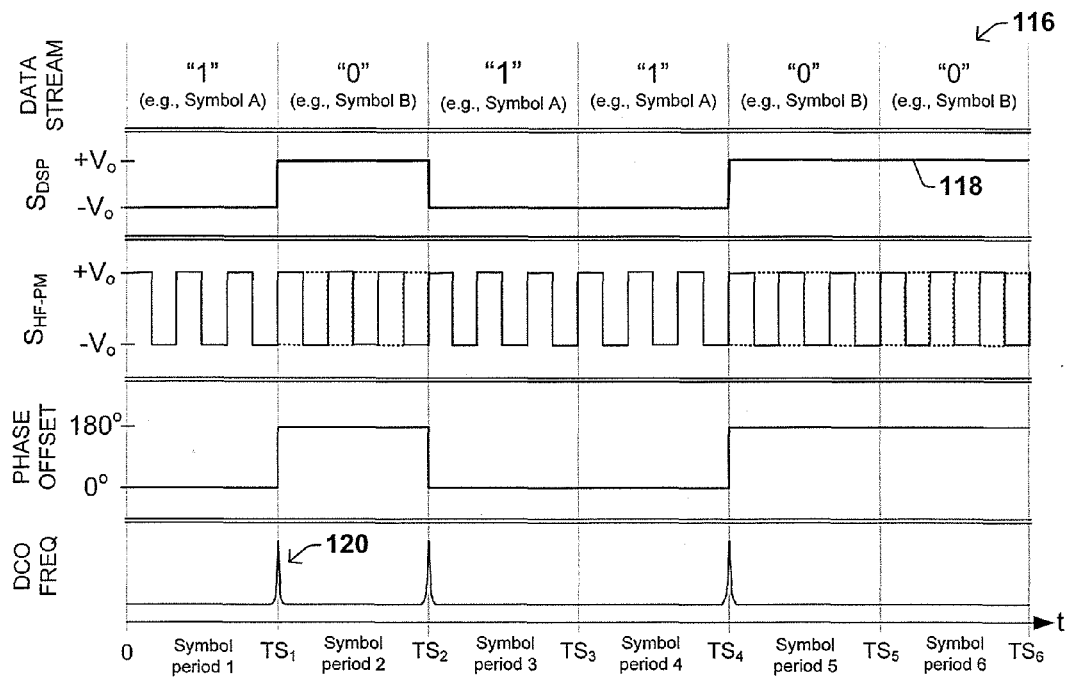
Prior Art FIG. 1A
Prior Art FIG. 1B
Prior Art FIG. 1C
Prior Art FIG. 1D

WIDE BAND POLAR MODULATOR

BACKGROUND

Wireless communication devices are becoming more and more common-place in today's society. During wireless communication, a wireless transmitter encodes a message as a digital bit stream (e.g., a stream of logical "1"s and "0"s), and then modulates the digital bit stream onto a carrier wave to generate a stream of symbols, where the symbols are somewhat akin to an alphabet for communicating devices. This stream of symbols is then transmitted to an intended wireless receiver over a wireless transmission medium (e.g., through the atmosphere). Upon accurately receiving the stream of symbols, the intended wireless receiver demodulates the symbols and decodes the digital bit stream to recover the originally transmitted message. Often, the receiver provides the message to an end user in the form of an audio and/or visual display (e.g., LCD screen and/or speaker), for example.

One type of modulation that wireless devices can use during such communication is polar modulation. FIG. 1A shows an example of a conventional polar modulator 100 that includes a digital signal processor 102, a voltage controlled oscillator (VCO) (or a digitally controlled oscillator (DCO)) 104, and an antenna 106. As discussed in more detail below, these components work in coordinated fashion to modulate a digital bit stream onto a carrier wave as a stream of symbols, thereby enabling wireless transmission via the antenna 106.

To illustrate one example of how symbols can be used to transmit a digital bit stream, FIG. 1B shows a voltage vs. time plot for two symbols consistent with a binary phase shift keying (BPSK) scheme. Relative to a carrier wave with a 0° phase offset (108), Symbol A 110 (which can be assigned to a logical "1") is transmitted with a 0° phase offset (i.e., in phase with the carrier wave 108). Symbol B 112 (which can be assigned to a logical "0") is transmitted with a 180° phase offset relative to the carrier wave 108. FIG. 1C shows a phase plot 114 of Symbol A 110 and Symbol B 112. Consistent with FIG. 1B, Symbol A 110 is characterized by a phase offset of 0° and Symbol B 112 is characterized by a phase offset of 180°, wherein both symbols have the same amplitude as evidenced by their equal radii as measured from the origin 114, which may also be referred to as a "zero crossing point."

FIG. 1D shows an example of how Symbol A 108 and Symbol B 110 can be used to transmit a digital bit stream 116 (e.g., a digital bit stream of "101100"). As shown, symbols are transmitted during respective symbol periods. For example, a first symbol (e.g., Symbol A corresponding to a logical "1" value), is transmitted during a first symbol period $TS_1$; a second symbol (e.g., Symbol B corresponding to a logical "0") is transmitted during a second symbol period $TS_2$; and so on. To transmit these symbols, the digital signal processor 102 abruptly alters a time-varying phase modulation control signal 118 to induce a phase shift in the output of the VCO-DCO 104. As can be seen from the bottom waveform of FIG. 1D, when the DSP abruptly changes the phase modulation control signal 118, a "frequency spike" occurs in the VCO-DCO output. For example, at symbol boundary $TS_1$ the DSP 102 alters the phase output from the VCO-DCO 104 to attempt to induce an immediate 180° phase shift between symbol A (used just prior to symbol boundary $TS_1$) and symbol B (used just after symbol boundary TS). However, because this sudden 180° phase shift requires a near infinite frequency (120) to achieve the phase change, this 180° phase shift is difficult to achieve with a VCO and/or DCO.

Hence, the present disclose has developed improved techniques for performing polar modulation. Among other advantages, at least some of these techniques make 180° phase shifts between adjacent symbols easier to achieve compared to conventional techniques.

BRIEF DESCRIPTION OF THE DRAWINGS

FIG. 1A illustrates a block diagram of a conventional polar modulator.

FIGS. 1B-1D illustrate one example of how the polar modulator of FIG. 1A can use two BPSK symbols to transmit a digital bit stream.

DETAILED DESCRIPTION

Figure 2:
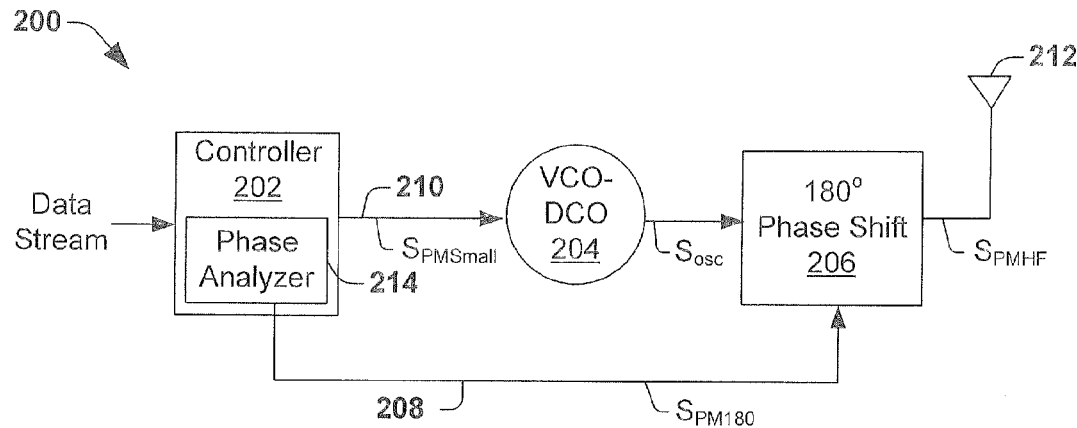
FIG. 2 illustrates an embodiment of polar modulator in accordance with some aspects of the present disclosure.

The present invention will now be described with reference to the attached drawing figures, wherein like reference numerals are used to refer to like elements throughout, and wherein the illustrated structures and devices are not necessarily drawn to scale.

Some aspects of the present disclosure provide for polar modulation techniques that utilize an 180° phase shift module disposed downstream of a VCO-DCO. In this configuration, the VCO-DCO can be used to achieve small phase shifts (e.g., less than or equal to 90°), and the downstream 180° phase shift module can be used to carry out precise and immediate 180° phase shifts. Because this configuration allows precise and immediate 180° phase shifts without "frequency spikes", it is useful in many contexts, such as in UMTS or LTE, where special filters (which are used to avoid immediate 180° phase shifts) can corrupt the information signals, for example.

FIG. 2 illustrates a polar modulator 200 in accordance with some embodiments. The polar modulator 200 includes a controller 202, a voltage-controlled or digitally-controlled oscillator (VCO-DCO) 204; and an 180° phase shift module 206 downstream of the VCO-DCO 204. The 180° phase shift module 206 is coupled to the controller 202 via an 180° phase shift control path 208. In many embodiments, the controller 202 is coupled to the VCO-DCO 204 via a phase modulation control path 210, which allows for phase shifts of other than 180°. As will be appreciated in more detail below, these components work in coordinated fashion to modulate a digital bit stream onto a carrier wave as a stream of symbols, thereby enabling wireless transmission via the antenna 212.

Figure 3:
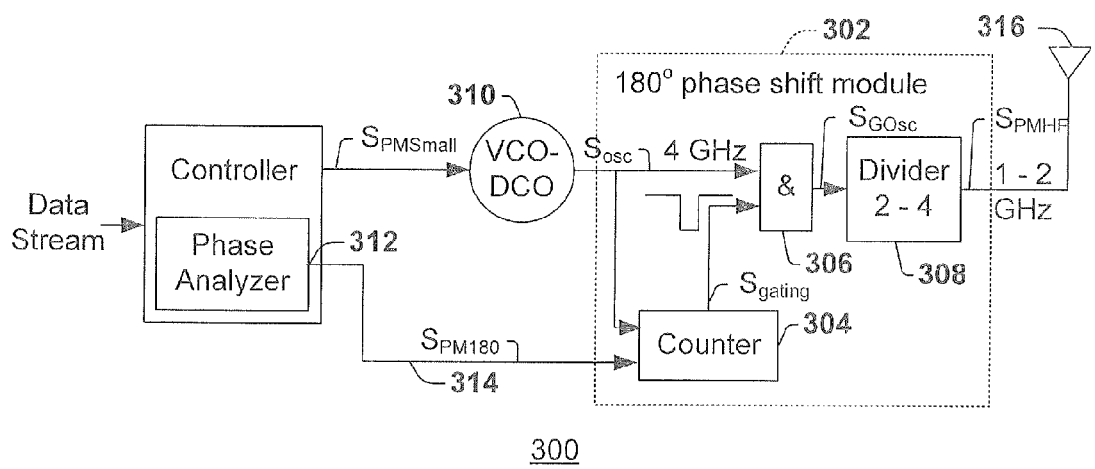
FIG. 3 illustrates a block diagram of a polar modulator that includes a 180° phase shift module in accordance with some embodiments.

FIG. 3 shows another example of a polar modulator 300 that includes another embodiment of a 180° phase shift module 302 (e.g., 180° phase shift module 206 in FIG. 2) downstream of a VCO-DCO 310. The illustrated 180° phase shift module 302 includes a counter 304, a gating module 306 (e.g., a logical AND gate) and a variable divider 308, which are operably coupled as shown. In particular, the counter 304 has first and second inputs, wherein the first input is coupled to an output of a VCO-DCO 310, and the second input is coupled to a phase analyzer 312 via a 180° phase shift control path 314. The gating module 306 also has first and second inputs that are coupled to outputs of the VCO-DCO 310 and an output of the counter 304, respectively. The variable divider 308 has an input coupled to an output of the gating module 306 and an output coupled to an RF antenna 316. In general, the variable divider can have a divisor ratio of 1/N (where N is any integer) at any given time, and where the divisor ratio can be changed for different times (e.g., from N to M (or vice versa), where M is any integer other than N). For purposes of clarity, N=2 and M=4 in the illustrated embodiment.

Figure 4A:
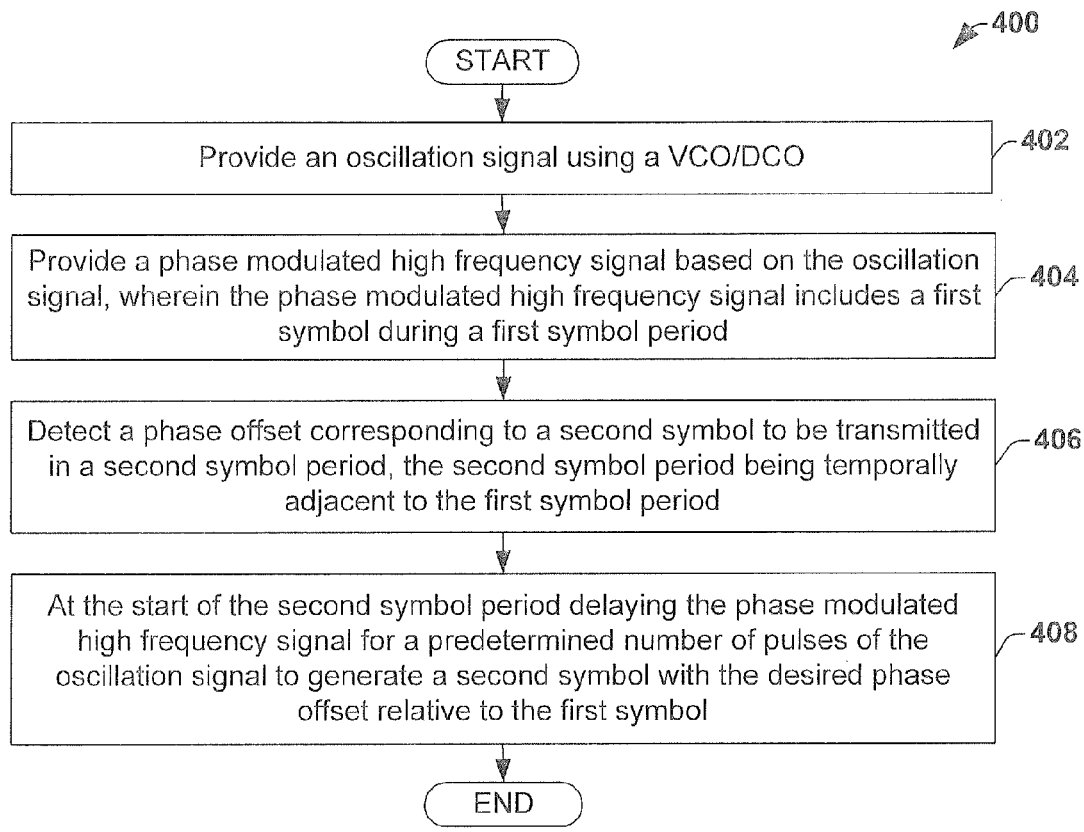
FIG. 4A illustrates a flow diagram showing a method in accordance with some embodiments.

FIG. 4A illustrates one operational method 400 of a polar modulator (e.g., polar modulator 200 in FIG. 2 and/or 300 in FIG. 3). The method begins at 402 when an oscillation signal is provided from a VCO-DCO (e.g., VCO-DCO 204 in FIG. 2 and/or 310 in FIG. 3). At 404, a phase modulated high frequency signal is transmitted based on the oscillation signal. This phase modulated high-frequency signal includes a first symbol during a first symbol period and can be output from a 180° phase shift module (e.g., 180° phase shift module 206 in FIG. 2 and/or 302 in FIG. 3). At 406, the method detects a phase offset corresponding to a second symbol, where the second symbol is to be transmitted in a second symbol period temporally adjacent to the first symbol period. At 408, at the start of the second symbol period, the phase modulated high frequency signal is delayed (e.g., held low or high) for a predetermined number of pulses of the oscillation signal to transmit a second symbol with the desired phase offset relative to the first symbol.

Figure 4B:
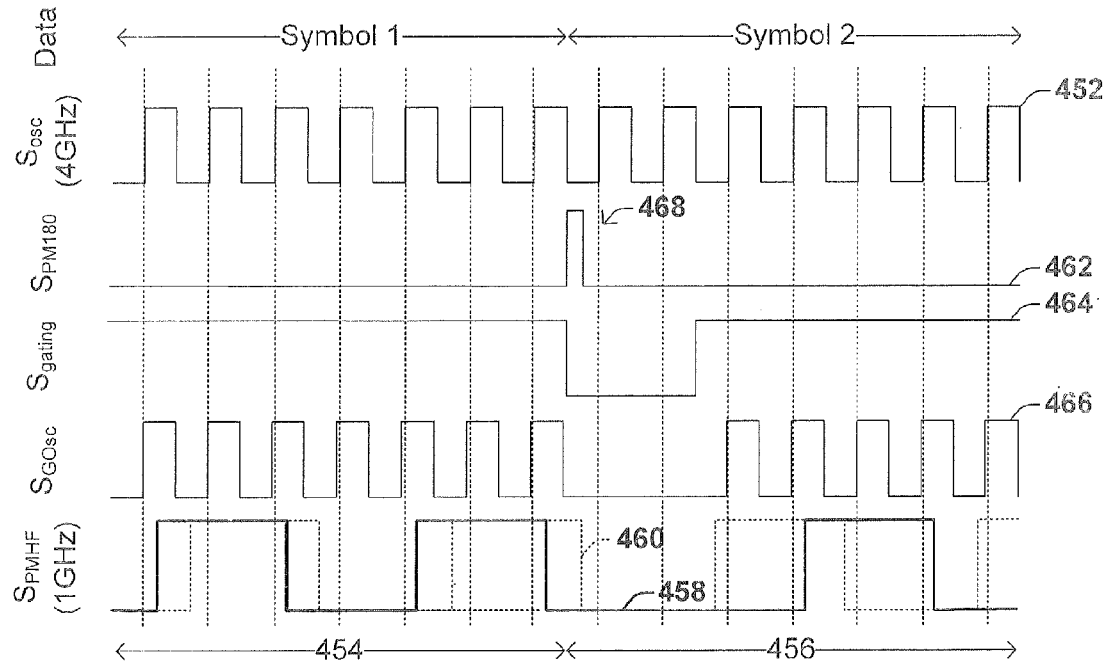
FIG. 4B illustrates an example timing diagram consistent with FIG. 3's embodiment.

FIG. 4B, which is discussed now with reference to FIG. 3's polar modulator 300, shows example timing diagram 400. During operation, the VCO-DCO 310 of FIG. 3 can generate an oscillating signal 452, which spans a first symbol period 454 a second symbol period 456, as shown in FIG. 4B. In the illustrated example, the oscillating signal 452 is provided at approximately 4 GHz, but it could be at higher or lower frequencies in other embodiments. Based on the oscillation signal 452, the divider 308 of FIG. 3 outputs a phase modulated high frequency signal 458, which includes a first symbol during the first symbol period 454 and a second symbol during the second symbol period 456 as shown in FIG. 4.

More particularly, the first symbol in the modulated high frequency signal is offset by 45° relative to a carrier wave 460. To transmit this first symbol, a 180° phase modulation control signal, $S_{PM180}$ (462) provided by the phase analyzer 312 is continuously de-asserted, which causes a gating signal 464 from the counter 304 to remain in a high state. Thus, the AND gate 306 outputs a gated VCO-DCO signal 466 to the divider 308. The divider 308, which for purposes of this example is set to a divide by four state, flips its output state for every two consecutive cycles of the gated VCO-DCO signal encountered, thereby providing the high-frequency phase modulated signal 458.

At a start of the second symbol period 456, the phase analyzer 312 determines a 180° phase offset is required for the second symbol, relative to the first symbol. Thus, the second symbol is to be transmitted with a 225° phase offset relative to the carrier wave 460. To facilitate this phase offset, the phase analyzer 312 asserts the 180° phase modulation control signal at 468. This causes the counter 304 to change its output state for a predetermined number of count cycles. While counting, the counter 304 holds the gating signal 464 low, which causes the gated VCO-DCO signal 466 to be correspondingly low and correspondingly delays the high-frequency phase modulated signal 458 provided by the divider 308. Upon the gated VCO-DCO signal 466 again becoming active, the divider 308 continues to flip its output state for every two consecutive cycles of the gated VCO-DCO signal encountered. Hence, the gating signal 464, effectively inserts the desired 180° phase shift for the second symbol, relative to the first symbol.

Figure 5:
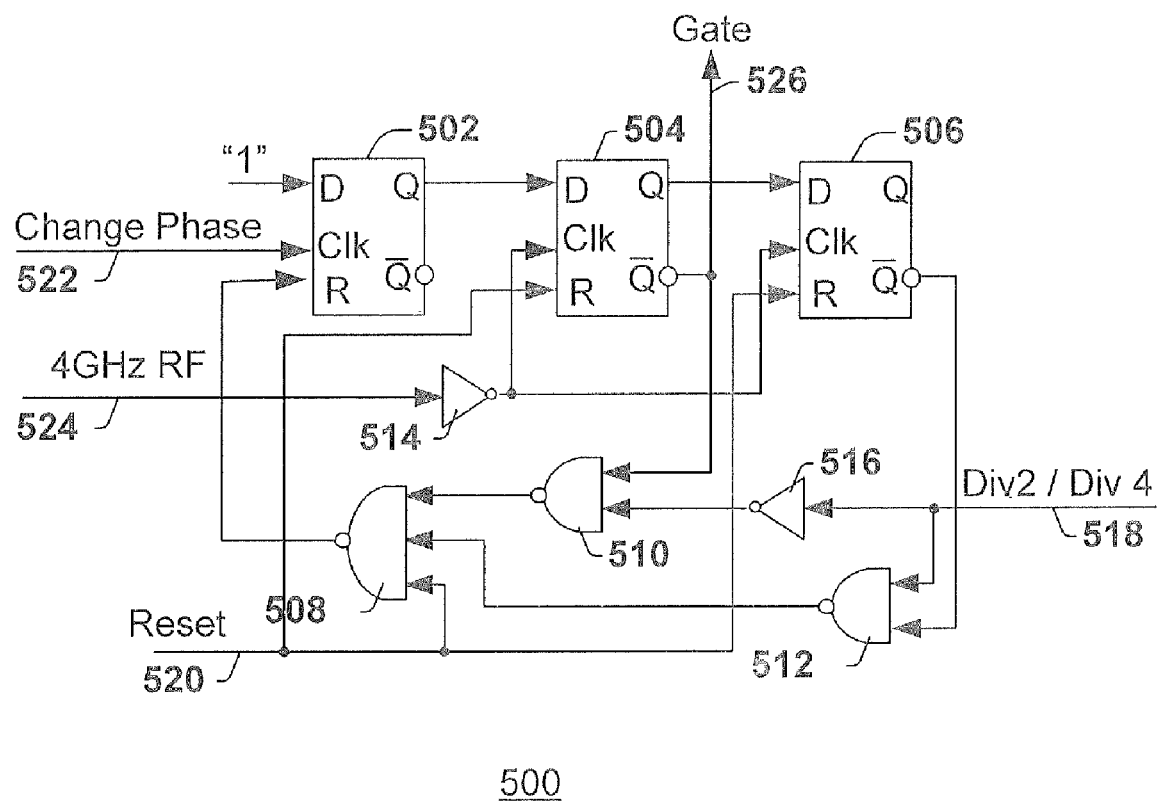
FIG. 5 illustrates a circuit diagram of a counter included in a 180° phase shift module in accordance with some embodiments.

FIG. 5 shows a more detailed example of how a counter module 500 (e.g., counter of FIG. 3) CaO be implemented. The illustrated counter 500 includes three D-flip-flops (502, 504, 506), three logical NAND gates (508, 510, 512), and two inverters (514, 116) operably coupled as shown. The counter module 500 is able to support division by two or four depending on the signal "Div2/Div4" 518.

When the module 500 is initially powered on, a common "Reset" line 520 is asserted to put flip-flops 504, 506 in a logical "0" state.

Because a "1" is present on 502's D-input, when the "change phase" signal is asserted on 522, it clocks the "1" through to 502's Q output. Generally, the next falling edge of the VCO-DCO oscillation signal on 524 (e.g., at 4 GHZ) correspondingly triggers the second Flip-Flop 504 to change from "0" to "1". The use of inverter 514, which causes 504 to be falling-edge triggered, helps ensure that the divider can finish the last transition. Correspondingly, the Q_bar output of 504 changes from "1" to "0" and drives the gating signal on 526 to the gating module (e.g., 306 in FIG. 10). The gating module holds the current state until the "gate" signal on 526 returns to "1".

For 2 GHz operation (high band) the divider is set to divide by 2 and only one input VCO-DCO pulse is cut out to realize a Phase change of 180°. In this case "Div2/Div4" line is set to "0", which holds the NAND gate 512 at "1" level. At the same time the "Div2/Div4" signal is inverted via inverter 516 to a "1", which enables the NAND gate 510 to transfer the logical "1" of flip-flop 504's O-bar to a logical "0" at the input of NAND gate 508. This logical "0" level immediately resets Flip-Flop 502 and the next FALLING edge of RF signal "4 GHz" on 524 will return the "GATE" signal on 526 to a logical "1", so with the next RAISING edge of "RF signal" the main divider will continue its work.

For 1 GHz output Signal (low band) the main Divider is dividing by 4 and two input pulses should be cut out to induce a 180° phase change. In this case "Div2/Div4" line 518 is set to a logical "1" and holds the NAND gate 510 output at a logical "1". At the same time "Div2/Div4" signal on 518 enables NAND gate 512 to transfer the Q_bar signal of Flip-Flop 506 to NAND 508. The D terminal of Flip-Flop 506 receives the Q Signal from flip flop 504 and changes its state exact one clock after 504, so the Reset Signal to 502 will come after 2 clock cycles of "4 GHz" RF signal. Thus, a 180° phase shift at 1 GHz is achieved.

Several examples of polar modulation methods in accordance with aspects of the present disclosure are now described below. In particular, FIG. 6 describes an example where a VCO-DCO (e.g., 204 in FIG. 2) continuously provides a 0° phase offset relative to a carrier wave, such that a 180° phase shift module (e.g., 206 in FIG. 2) provides selective 180° phase shifts to modulate data (e.g., modulation control path 210 in FIG. 2 can be omitted). FIG. 7 describes an example where the VCO-DCO provides a constant, non-zero phase shift and wherein the 180° phase shift module performs selective 180° phase shifts to modulate data. Finally, FIGS. 8-10 describe an example where the VCO-DCO provides a time varying phase shift in combination with selective 180° phase shifts by the 180° phase shift module. Although these examples are illustrated and described below as a series of acts, events, and/or waveforms, it will be appreciated that the illustrated ordering of such acts, events and/or waveforms are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases. Actual waveforms may vary significantly from those illustrated, which are merely provided for purposes of understanding.

Figure 6:
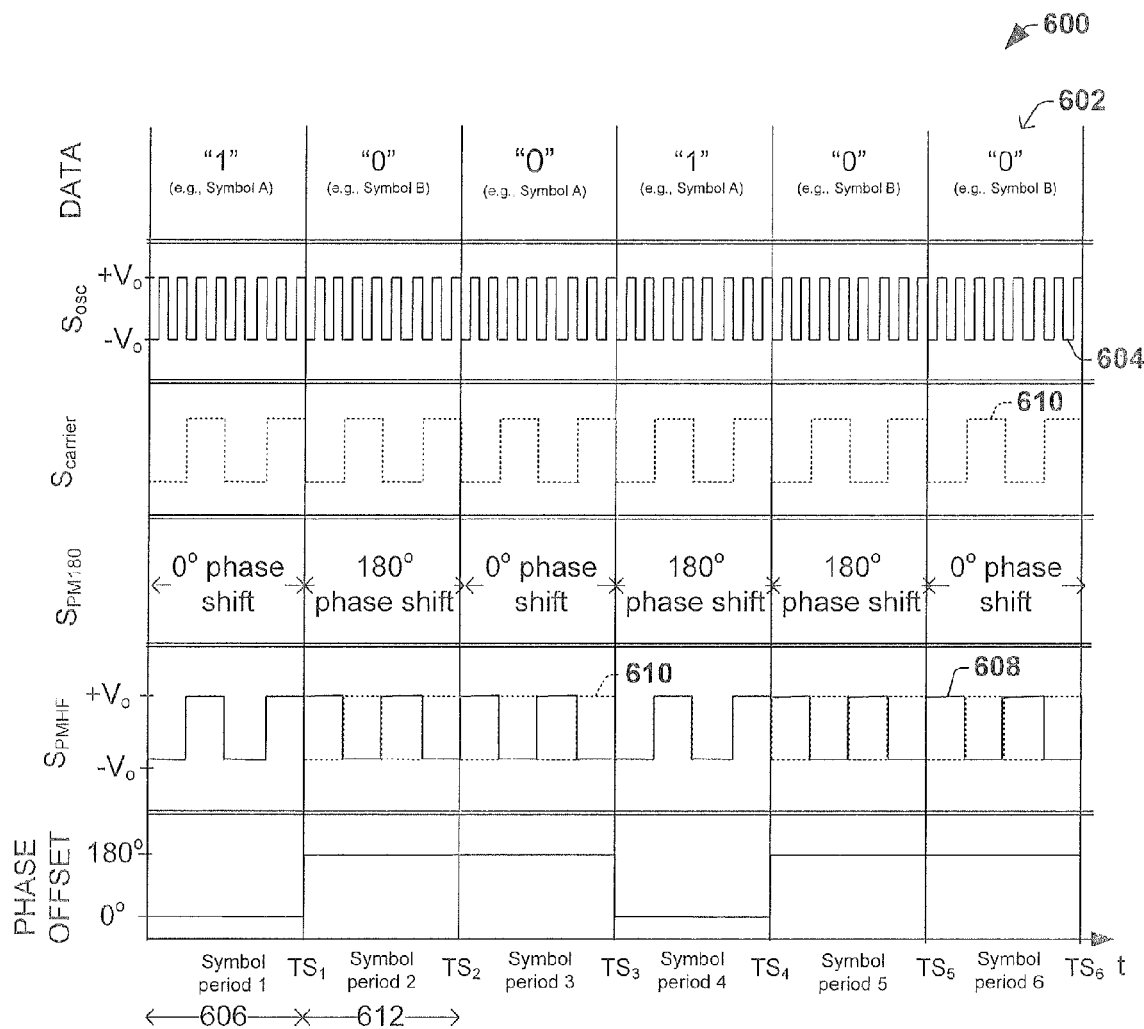
FIG. 6 illustrates an example timing diagram illustrating how two BPSK symbols having 0° and 180° phase offsets can be used to transmit a digital bit stream.
Figure 7:
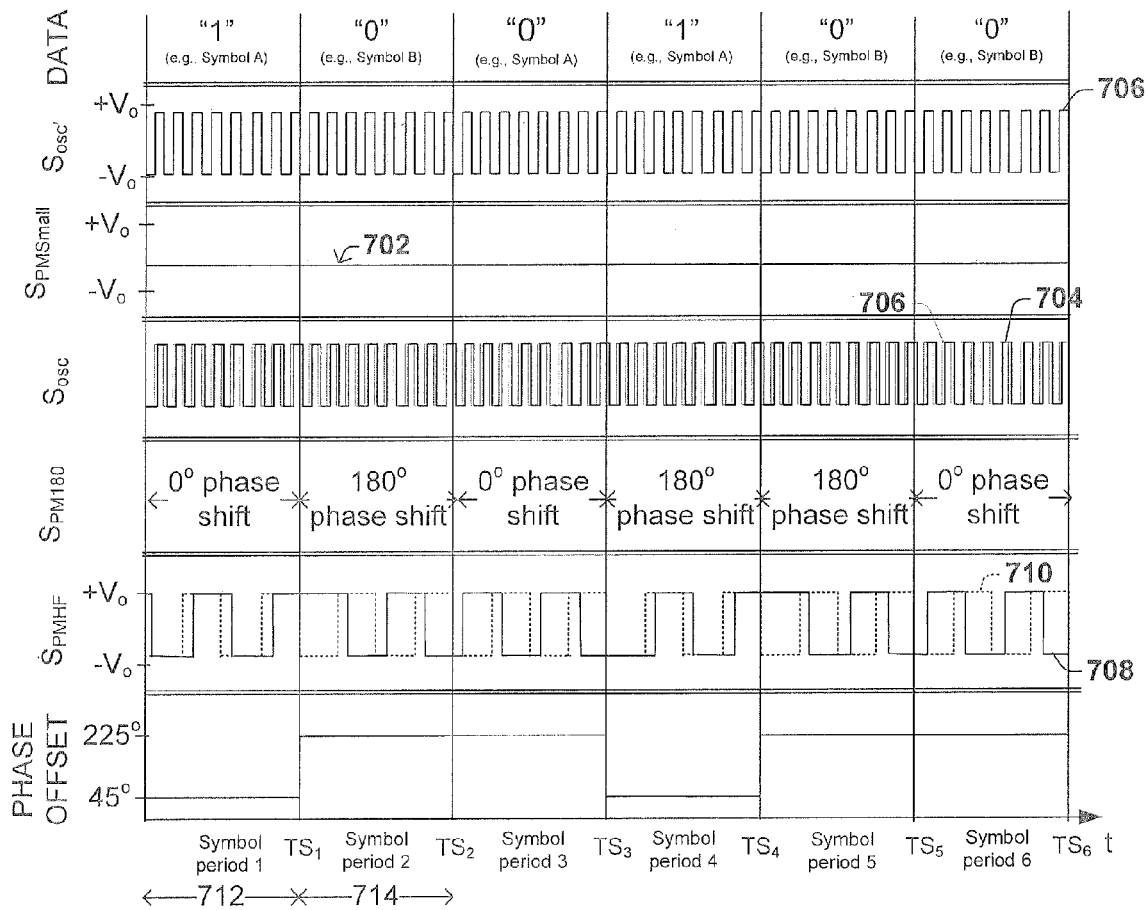
FIG. 7 illustrates an example timing diagram illustrating how two BPSK symbols having 45° and 225° phase offsets can be used to transmit a digital bit stream.

FIG. 6 shows an example timing diagram 600 that illustrates how a bit stream 602 (e.g., "100100") can be transmitted. The second line of FIG. 6 shows an oscillation signal 604. $S_{OSC}$, provided by a VCO-DCO.

For a first symbol period 606, during which a "1" is to be transmitted, the phase modulated high frequency signal, $S_{PMHF}$ 608, output from the 180° phase shift module is in-phase (0° phase shift) with a carrier wave 610.

For a second symbol period 612, during which a "0" is to be transmitted, the 180° phase shift module injects an 180° phase shift into the phase modulated high frequency signal $S_{PMHF}$ 608. To determine when a 180° phase shift is required, a phase analyzer (e.g., 214 in FIG. 2) can analyze digital samples from the data stream, which describe the first and second symbols, and can correspondingly assert the $S_{PM180}$ signal.

Ultimately, the presence or absence of a 180° phase offset informs an intended receiver what symbol is transmitted, such that the intended receiver can determine whether the symbol corresponds to a "1" or "0" bit. Subsequent symbols are modulated in a similar manner.

FIG. 7 shows a method that is somewhat similar to the method of FIG. 6, except that FIG. 7's method selectively performs 180° phase shifts while a controller (e.g., controller 202 in FIG. 2) provides a modulation control signal that induces a constant, non-zero phase offset in the oscillation signal from the VCO-DCO. To induce this constant, non-zero phase offset, a bias 702 is applied to the VCO-DCO. This constant bias 702 induces a modulated oscillation signal 704 that is phase shifted by a constant amount (e.g., 45°) relative to the VCO-DCO's native oscillation signal 706, on which a carrier wave 710 is based. Based on the data to be transmitted, a 180° phase shift control signal, $S_{PM180}$ selectively induces an 180° phase shift to the phase modulated high frequency signal. $S_{PMHF}$ 708, such that the phase modulated high frequency signal, $S_{PMHF}$ 708 is either 45° phase shifted or 225° phase shifted, relative to the carrier wave 710. For example, during a first symbol period 712, a logical "1" is modulated onto a symbol having a 45° phase offset, and during a second symbol period 714, the 180° phase shift control signal, $S_{PM180}$ is asserted so the phase modulated high frequency signal, $S_{PMHF}$ shifts to have a 225° phase offset. Again, a relative phase shift of 45° or 225° informs an intended receiver what symbol is present (e.g., a logical "1" or a logical "0").

Figure 8:
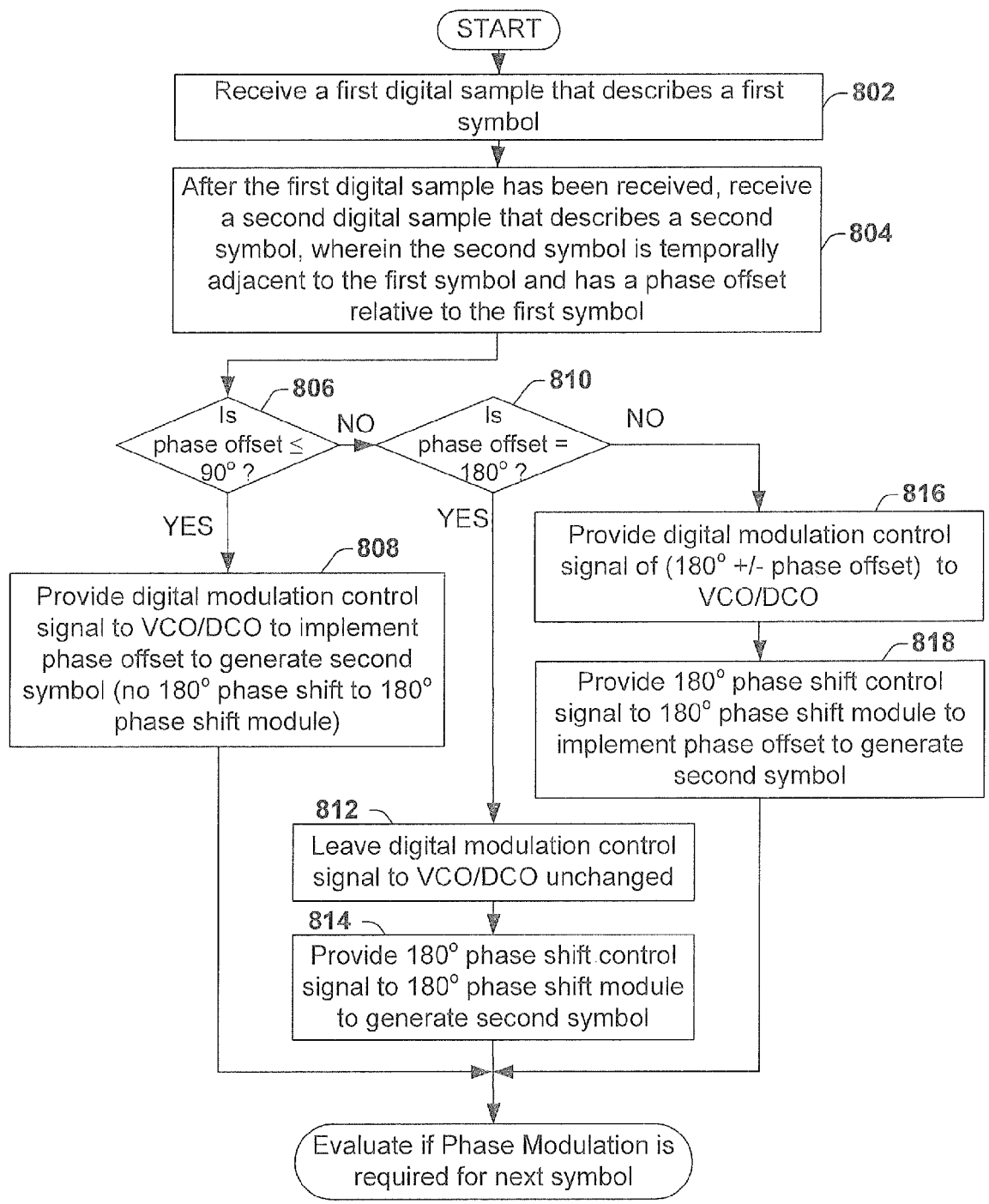
FIG. 8 is a flow diagram showing a method in accordance with some embodiments.
Figure 9:
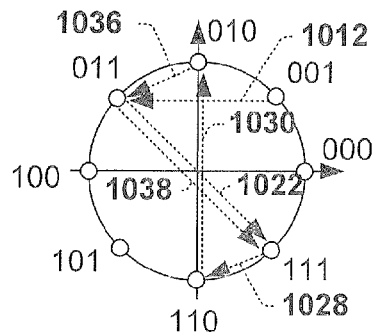
FIGS. 9 and 10 illustrate an example phase plot and an example timing diagram, respectively, of an 8-PSK scheme carried out in a manner consistent with FIG. 8's method.
Figure 10:
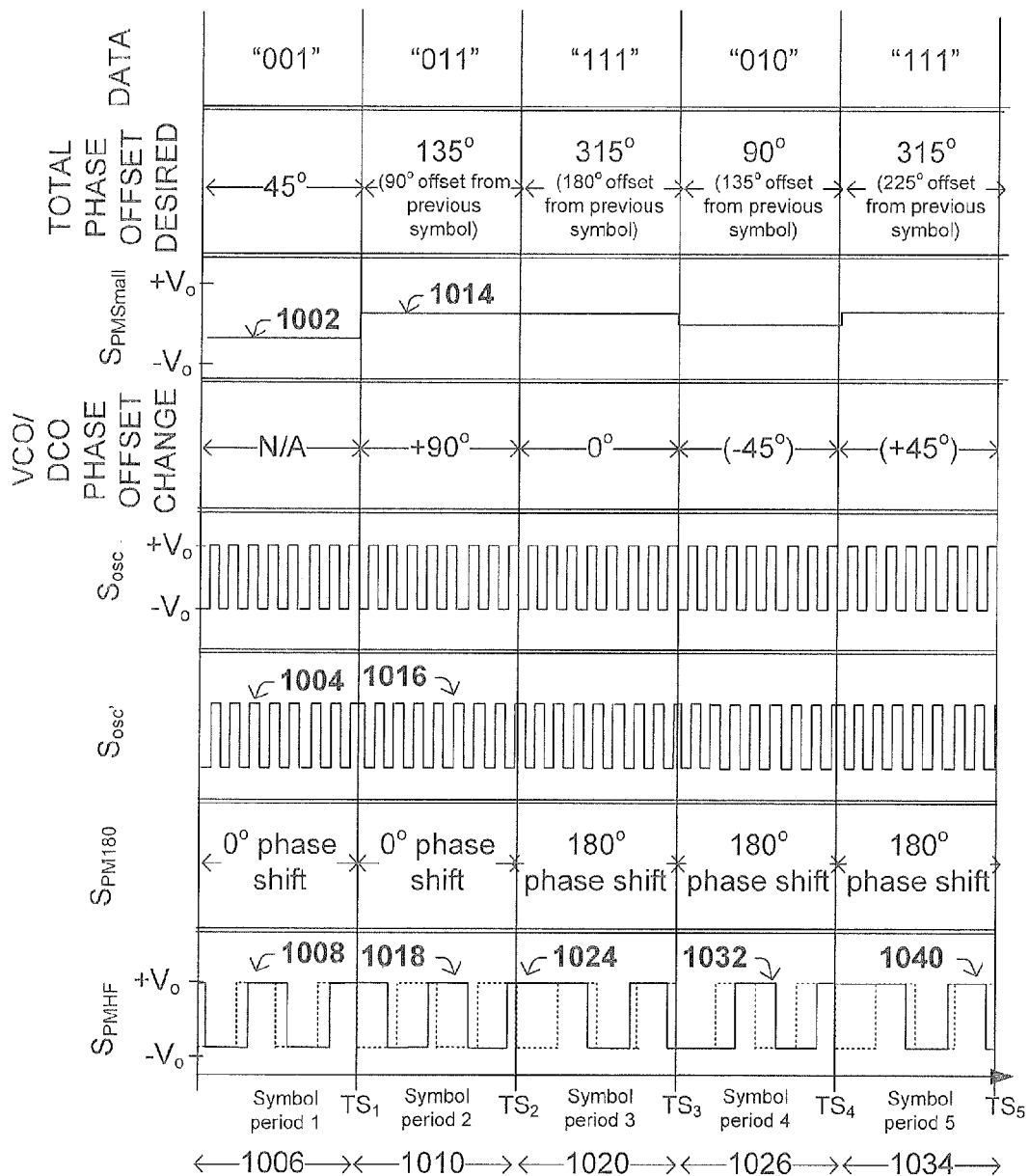

FIGS. 8-10 all relate to examples wherein small scale phase shifts (e.g., less than or equal to 90°) are performed using a VCO-DCO (e.g., VCO-DCO 204 in FIG. 2), at times in combination with large scale (e.g., 180°) phase shifts by a 180° phase shift module (e.g., 206 in FIG. 2). FIG. 8 discusses a more general methodology, while FIGS. 9-10 discuss a more particular example in the context of an 8-phase shift keying modulation scheme (8-psk).

The method of FIG. 8 starts at 802 when a first digital sample, which describes a first symbol, is received by a controller (e.g., controller 202 of FIG. 2).

At 804, after the first digital sample has been received, a second digital sample is received by the controller. The second digital sample describes a second symbol, wherein the second symbol is temporally adjacent to the first symbol and has a phase offset relative to the first symbol. Often a phase analyzer (e.g., phase analyzer 214 included within controller 202 in FIG. 2) compares the first and second digital samples to determine the phase offset therebetween.

At 806, the method determines whether the phase offset is less than or equal to 90°. If so ('YES' at 806), the method continues to 808 where the controller provides a modulation control signal, $S_{PMSmall}$ to the VCO-DCO to implement this small phase offset, thereby generating the second symbol. Because the phase offset is 90° or less, the 180° phase shift module does not induce an 180° phase shift in this instance.

If the phase offset is greater than 90° ('NO' at 806), the method proceeds to 810 to determine whether the phase offset between the first and second symbols is 180°. If so ('YES' at 810), the method leaves the digital modulation control signal $S_{PMSmall}$ applied to the VCO-DCO unchanged, and concurrently provides a 180° phase shift control signal $S_{PM180}$ to the 180° phase shift module, thereby generating the second symbol with a 180° phase shift relative to the first symbol.

Lastly, if the phase offset is greater than 90° and other than 180° ("NO" at 810), the method provides a modulation control signal $S_{PMSmall}$ equal to the quantity (180° plus or minus the phase offset to the VCO-DCO). The method also concurrently provides a 180° phase shift control signal $S_{PM180}$ to the 180° phase shift control module to implement the phase offset for the second symbol.

After the second symbol has been generated (e.g., by path 808, by path 812/814, or by path 816/818), phase offset for the next symbol can be evaluated. Modulation can continue in this manner until the entire data stream has been transmitted as a stream of symbols.

For purposes of clarity, FIGS. 9-10 discuss a more particular example of how FIG. 8's method can be utilized in the context of an 8 phase shift keying (PSK) modulation scheme. It will be appreciated that these figures depict a special case of transmitting non-filtered 8-PSK signals for illustration purposes only, and that such a case will not likely appear in actual systems. FIG. 9 shows an example phase diagram of eight symbols used in FIG. 10's waveform example (discussed further herein). In FIG. 9, the eight symbols represent eight different bit patterns (000, 001, 010, 011, 100, 101, 110, 111, respectively) and are associated with eight different phase offsets (0°, 45°, 90°, 135°, 180°, 225°, 270°, and 315°, respectively), wherein the phase offsets are relative to an expected carrier wave. In general, changing from one symbol (e.g., 001) to another symbol (e.g., 101) can be viewed as crossing from one phase offset (e.g., 45°) to another phase offset (e.g., 225').

FIG. 10 shows how these eight symbols can be used to transmit an example bit stream of 001011111010111. At the left of the timing diagram, a controller determines the first three bits "001" of the digital bit stream are to be mapped to a corresponding phase offset of 45° when transmitted as a symbol, corresponding to the phase diagram in FIG. 9. To achieve this phase offset, a small phase modulation signal, $S_{PMSmall}$, is set to a voltage level 1002 to induce the VCO-DCO to deliver this 45° phase offset. The VCO-DCO outputs an appropriate modulated signal, $S_{Osc}$ at 1004. Thus, during a first symbol period 1006, no 180° phase offset is needed, so the 180° phase shift module leaves $S_{OSC'}$ 1004 unchanged, thereby delivering a phase modulated high frequency signal, $S_{PMHF}$, with a 45° phase offset at 1008.

During a second symbol period 1010, the controller desires to switch to a bit pattern of 011, which corresponds to a total phase offset of 135° for the corresponding symbol, as shown in FIG. 9. Thus, a phase analyzer determines a 90° phase shift is required relative to the first symbol (see line 1012 in FIG. 9), and thus the controller changes the level of the $S_{PMSmall}$ signal at 1014 in FIG. 10 to induce a 90° phase shift in the VCO-DCO, as shown at 1016. Again, no 180° phase shift is needed during the second symbol period 1010, so the VCO-DCO leaves the modulated oscillation signal $S_{Osc'}$ unchanged to deliver $S_{PMHF}$ with a 135° phase offset at 1018.

During a third symbol period 1020, a bit pattern of "111" is to be transmitted, which corresponds to a phase offset of 315° for the corresponding symbol as shown in FIG. 9. The phase analyzer determines a 180° phase offset is required relative to the second symbol (see line 1022 in FIG. 10), and then asserts the $S_{PM180}$ signal while leaving the $S_{PMSmall}$ signal to the VCO-DCO unchanged. The result is the $S_{PMHF}$ signal output from the 180° phase shift module having a 315° phase shift as shown at 1024.

During a fourth symbol period 1026, a bit pattern of "010" is to be transmitted, which corresponds to a phase offset of 90° for the corresponding symbol as shown in FIG. 9. The phase analyzer determines a 135° phase offset is required relative to the third symbol of 1020. In this instance, the controller makes the phase change by using both the VCO-DCO and the 180° phase change module. In particular, the controller shifts the level of the $S_{PMSmall}$ signal to provide a)(−45° phase shift from the VCO-DCO (see line 1028 in FIG. 8) while concurrently asserting the $S_{PM180}$ signal to induce a 180° phase shift (see line 1030 in FIG. 8). Thus a total phase shift of (−45°±180°=135° is provided relative to the previous symbol. The end result is the $S_{PMHF}$ signal is delivered with a 90° phase shift relative to a carrier wave at 1032.

During a fifth symbol period 1034, a bit pattern of "111" is to be transmitted, which corresponds to a phase offset of 315° for the corresponding symbol as shown in FIG. 9. The phase analyzer determines a 225° phase offset is required relative to the fourth symbol of 1026. In this instance, the controller again makes the phase change by using both the VCO-DCO and the 180° phase change module. In particular, the controller shifts the level of the $S_{PMSmall}$ signal to provide a (+45°) phase shift from the VCO-DCO (see line 1036 in FIG. 11) while concurrently asserting the $S_{PM180}$ signal to induce a 180° phase shift (see line 1038 in FIG. 9). Thus a total phase shift of (+45°±180°=225°) is provided relative to the previous symbol. The end result is the $S_{PMHF}$ signal is delivered with a 315° phase shift relative to a carrier wave at 1040.

Consequently, as can be seen from FIG. 10, a relatively small phase shift provided by a VCO-DCO can be adjusted in combination with a 180° phase shift provide by a 180° phase shift module downstream of the VOO-DOO to provide desired functionality.

Although the invention has been illustrated and described with respect to one or more implementations, alterations and/or modifications may be made to the illustrated examples without departing from the spirit and scope of the appended claims. The claimed subject matter may be implemented as a method, apparatus, or article of manufacture using standard programming and/or engineering techniques to produce software, firmware, hardware, or any combination thereof to control a computer to implement the disclosed subject matter (e.g., the circuits shown in FIGS. 2, 3, and 5; are non-limiting examples of circuits that may be used to implement methods of FIGS. 4 and 6-10). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

In particular regard to the various functions performed by the above described components or structures (assemblies, devices, circuits, system, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A circuit, comprising:
   a controller to provide one or more control signals indicative of a digital data stream to be transmitted;
   a voltage-controlled or digitally-controlled oscillator (VCO-DCO) downstream of the controller and coupled to the controller via a phase modulation control path; and
   a 180° phase shift module downstream of the VCO-DCO and coupled to the controller via a 180° phase shift control path, wherein the 180° phase shift module comprises:
   a counter having a first input coupled to an output of the VCO-DCO, a second input coupled to the 180° phase shift control path, and an output;
   a gating module having a first input coupled to the output of the VCO-DCO, a second input coupled to the output of the counter, and an output; and
   a variable divider having an input coupled to the output of the gating module.

2. The circuit of claim 1, wherein the counter comprises:
   a plurality of flip-flops, wherein at least one of the plurality of flip-flops is triggered on a falling edge of a clock signal.

3. The circuit of claim 1, wherein the counter is configured to count a predetermined number of pulses of an oscillation signal provided by the VCO-DCO and provide a control signal when the predetermined number of pulses has been counted.

4. The circuit of claim 1, wherein the controller comprises:
   a phase analyzer to receive first and second digital samples corresponding to first and second temporally adjacent symbols, respectively, and configured to selectively provide a 180° phase shift control signal to the 180° phase shift module based on a phase offset between the first and second temporally adjacent symbols.

5. The circuit of claim 4, further comprising:
a radio frequency antenna coupled to the 180° phase shift module and configured to receive a phase modulated high frequency signal therefrom, wherein the phase modulated high frequency signal is based on an oscillation signal provided by the VCO-DCO and includes the first and second temporally adjacent symbols.

6. The circuit of claim 5, wherein the 180° phase shift module comprises:
a counter configured to hold the phase modulated high frequency signal for a predetermined number of pulses of the oscillation signal to induce the phase offset for the second symbol, relative to the first symbol.

7. The circuit of claim 1, wherein the controller is configured to provide a phase modulation control signal to the VCO-DCO via the phase modulation control path to selectively induce a phase shift between two consecutive symbols output from the 180° phase shift module.

8. The circuit of claim 7, wherein the phase shift provided by the VCO-DCO has a magnitude of less than or equal to approximately 90°.

9. The circuit of claim 8, wherein the controller is configured to provide a 180° phase shift control signal to the 180° phase shift module via the 180° phase shift control path in coordinated fashion with the phase modulation control signal delivered to the VCO-DCO via the phase modulation control path.

10. The circuit of claim 9, where the 180° phase shift control signal and the phase modulation signal cooperatively provide a phase shift having a magnitude of greater than approximately 90° and less than approximately 270° between the two consecutive symbols.

11. The circuit of claim 1, wherein the VCO-DCO is configured to provide an immediate and precise 180° phase shift between temporally adjacent symbols.

12. A method, comprising:
providing an oscillation signal using a voltage-controlled or digitally-controlled oscillator (VCO-DCO), the oscillation signal comprising pulses;
providing a phase modulated high frequency signal based on the oscillation signal, wherein the phase modulated high frequency signal includes a first symbol during a first symbol period;
detecting a desired phase offset for a second symbol to be transmitted in a second symbol period temporally adjacent to the first symbol period;
at the start of the second symbol period, delaying the phase modulated high frequency signal for a predetermined number of pulses of the oscillation signal to generate the second symbol with the desired phase offset relative to the first symbol.

13. The method of claim 12, wherein the phase modulated high frequency signal has a frequency that is less than a frequency of the oscillation signal.

14. The method of claim 12, wherein the phase offset is 180°.

15. A circuit, comprising:
a controller including a phase analyzer to determine a phase offset between first and second temporally adjacent symbols;
a voltage-controlled or digitally-controlled oscillator (VCO-DCO) downstream of the controller and coupled to the controller via a phase modulation control path, the VCO-DCO configured to provide a modulated oscillation signal made up of pulses; and
a 180° phase shift module downstream of the VCO-DCO and coupled to the controller via a 180° phase shift control path, the 180° phase shift module comprising a counter configured to selectively hold the phase modulated high frequency signal at a first state for a predetermined number of pulses of the modulated oscillation signal or not hold the phase modulated high frequency signal at the first state for the predetermined number of pulses based on the phase offset.

* * * * *